(12) United States Patent
Lee et al.

(10) Patent No.: US 11,323,093 B2
(45) Date of Patent: May 3, 2022

(54) BULK-ACOUSTIC WAVE RESONATOR

(71) Applicant: Samsung Electro-Mechanics Co., Ltd., Suwon-si (KR)

(72) Inventors: Tae Hun Lee, Suwon-si (KR); Chang Hyun Lim, Suwon-si (KR); Sang Kee Yoon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 138 days.

(21) Appl. No.: 16/875,019

(22) Filed: May 15, 2020

(65) Prior Publication Data

US 2021/0075398 A1 Mar. 11, 2021

(30) Foreign Application Priority Data

Sep. 6, 2019 (KR) .................... 10-2019-0110914
Jan. 2, 2020 (KR) .................... 10-2020-0000401

(51) Int. Cl.
*H03H 9/17* (2006.01)
*H03H 9/05* (2006.01)
*H03H 9/02* (2006.01)
*H03H 3/02* (2006.01)
*H03H 9/13* (2006.01)

(52) U.S. Cl.
CPC .............. *H03H 9/174* (2013.01); *H03H 3/02* (2013.01); *H03H 9/02015* (2013.01); *H03H 9/0514* (2013.01); *H03H 9/131* (2013.01); *H03H 2003/023* (2013.01)

(58) Field of Classification Search
CPC ...... H03H 9/174; H03H 3/02; H03H 9/02015; H03H 9/0514; H03H 9/131; H03H 2003/023; H03H 9/02118; H03H 9/1014; H03H 9/105; H03H 9/173; H03H 9/02007; H03H 9/15
USPC ......................................... 333/133, 187, 188
See application file for complete search history.

(56) References Cited

U.S. PATENT DOCUMENTS

2015/0207490 A1 7/2015 Taniguchi et al.
2019/0386641 A1* 12/2019 Lee ................... H03H 9/174

FOREIGN PATENT DOCUMENTS

JP 6302263 B2 3/2018
JP 6556173 B2 8/2019

* cited by examiner

*Primary Examiner* — Rakesh B Patel
*Assistant Examiner* — Jorge L Salazar, Jr.
(74) *Attorney, Agent, or Firm* — NSIP Law

(57) ABSTRACT

A bulk-acoustic wave resonator includes: a resonator comprising a central portion in which a first electrode, a piezoelectric layer, and a second electrode are sequentially stacked on a substrate, and an extension portion disposed along a periphery of the central portion; and an insertion layer disposed below the piezoelectric layer in the extension portion to raise the piezoelectric layer. The insertion layer may have a first inclined surface formed along a side surface facing the central portion, and the first electrode may have a second inclined surface extending from a lower end of the first inclined surface of the insertion layer.

20 Claims, 7 Drawing Sheets

BULK-ACOUSTIC WAVE RESONATOR

CROSS-REFERENCE TO RELATED APPLICATION(S)

This application claims the benefit under 35 USC 119(a) of Korean Patent Application Nos. 10-2019-0110914 filed on Sep. 6, 2019, and 10-2020-0000401 filed on Jan. 2, 2020, in the Korean Intellectual Property Office, the entire disclosures of which are incorporated herein by reference for all purposes.

BACKGROUND

1. Field

The present disclosure relates to a bulk-acoustic wave resonator.

2. Description of the Background

In accordance with a trend for miniaturization of wireless communication devices, miniaturization of a high frequency component technology is actively demanded. For example, a bulk-acoustic wave (BAW) type filter using a semiconductor thin film wafer manufacturing technology may be used.

A bulk-acoustic wave (BAW) resonator is a thin film type element causing resonance by depositing a piezoelectric dielectric material on a silicon wafer, a semiconductor substrate, and using the piezoelectric characteristics thereof, to be implemented as a filter.

Recently, technological interest in 5G communications is increasing, and development of technologies that can be implemented in candidate bands is being actively performed.

However, in the case of 5G communications using a Sub 6 GHz (4 to 6 GHz) frequency band, since the bandwidth is increased and the communication distance is shortened, the strength or power of the signal may be increased. In addition, as the frequency increases, loss generated in the piezoelectric layer or the resonator may increase.

Therefore, there is a demand for a bulk-acoustic wave resonator capable of minimizing energy leakage in the resonator.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes a resonator including a central portion in which a first electrode, a piezoelectric layer, and a second electrode are sequentially stacked on a substrate, and an extension portion disposed along a periphery of the central portion, and an insertion layer disposed below the piezoelectric layer in the extension portion to raise the piezoelectric layer. The insertion layer has a first inclined surface formed along a side surface facing the central portion, and the first electrode has a second inclined surface extending from a lower end of the first inclined surface of the insertion layer.

The second inclined surface may have a lower inclination angle than the first inclined surface.

The first electrode may include a thickness of a lower end portion of the second inclined surface less than a thickness of an upper end portion of the second inclined surface.

The second inclined surface may be disposed in a central portion.

The first electrode may be an upper surface in the central portion and an upper surface in the extension portion disposed on different planes from each other.

The bulk-acoustic wave resonator may further include a membrane layer disposed below the first electrode and the insertion layer to support the resonator, and a cavity separating the resonator from the substrate.

A third inclined surface may be disposed along an end of the first electrode, and the membrane layer may have a fourth inclined surface extending from a lower end of the third inclined surface.

The fourth inclined surface may include a lower inclination angle than the third inclined surface.

An end of the insertion layer may contact the third inclined surface of the first electrode.

The insertion layer may be thicker than the first electrode.

The bulk-acoustic wave resonator may further include a cap accommodating the resonator therein and bonded to the substrate.

The bulk-acoustic wave resonator may further include a plurality of via holes disposed to penetrate the cap, and a plurality of connection conductors disposed in the plurality of via holes to electrically connect the first electrode and the second electrode to an outside.

The bulk-acoustic wave resonator may further include external electrodes bonded to the plurality of connection conductors exposed to an external surface of the cap.

The bulk-acoustic wave resonator may further include a first metal layer and a second metal layer disposed outside of the resonator and bonded to the first electrode and the second electrode, respectively. The plurality of connection conductors may be electrically connected to the first electrode and the second electrode, respectively, via the first metal layer and the second metal layer.

The piezoelectric layer may include an inclined portion disposed on the first inclined surface, and an end of the second electrode may be disposed on the inclined portion of the piezoelectric layer.

In another general aspect, a bulk-acoustic wave resonator includes a resonator including a central portion in which a first electrode, a piezoelectric layer, and a second electrode are sequentially stacked on a substrate, and an extension portion disposed along a periphery of the central portion, and an insertion layer disposed below the piezoelectric layer in the extension portion to raise the piezoelectric layer, wherein the first electrode includes a thickness in the central portion less than a thickness in the extension portion.

In another general aspect, a bulk-acoustic wave resonator includes a central portion comprising a first electrode, a piezoelectric layer, and a second electrode sequentially stacked on a substrate, and an extension portion including the first electrode, an insertion layer, the piezoelectric layer, and the second electrode sequentially stacked on the substrate disposed along a periphery of the central portion, wherein the first electrode includes a first reflective interface in the central portion.

The first reflective interface may include an inclined surface extending from a lower end of the insertion layer facing the central portion.

The bulk-acoustic wave resonator may further include a membrane layer disposed below the first electrode to support the first electrode, and a cavity separating the first electrode from the substrate, wherein the membrane layer may include a second reflective interface in the extension portion.

The second reflective interface may include an inclined surface extending from a lower end of the first electrode facing away from the central portion.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
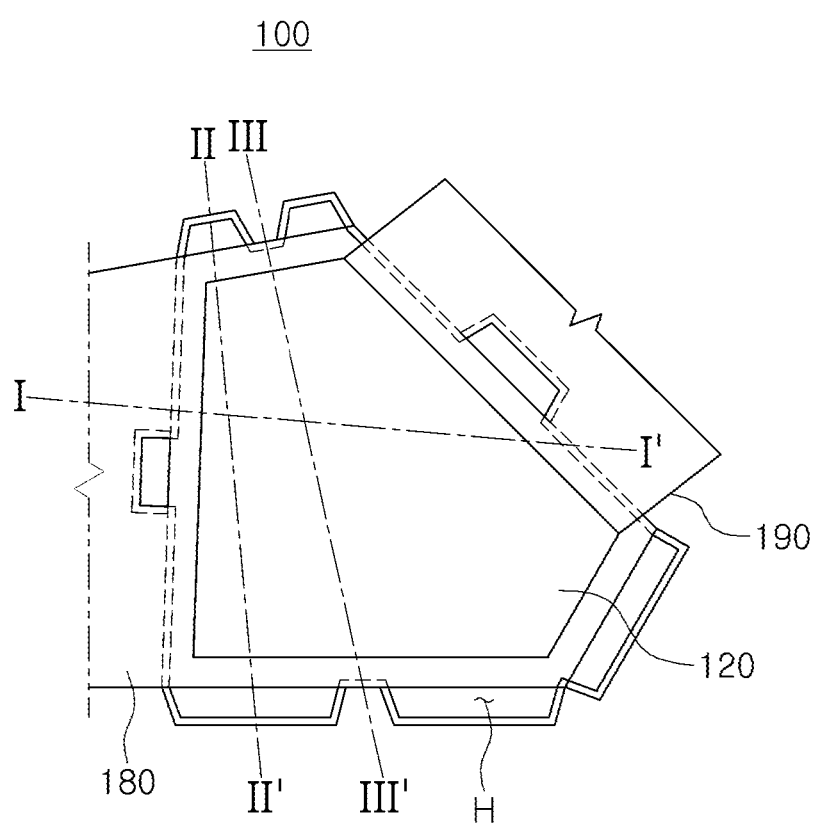
FIG. 1 is a plan view of an acoustic-wave resonator according to an embodiment of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

An aspect of the present disclosure is to provide a bulk-acoustic wave resonator capable of reducing energy leakage.

Figure 2:
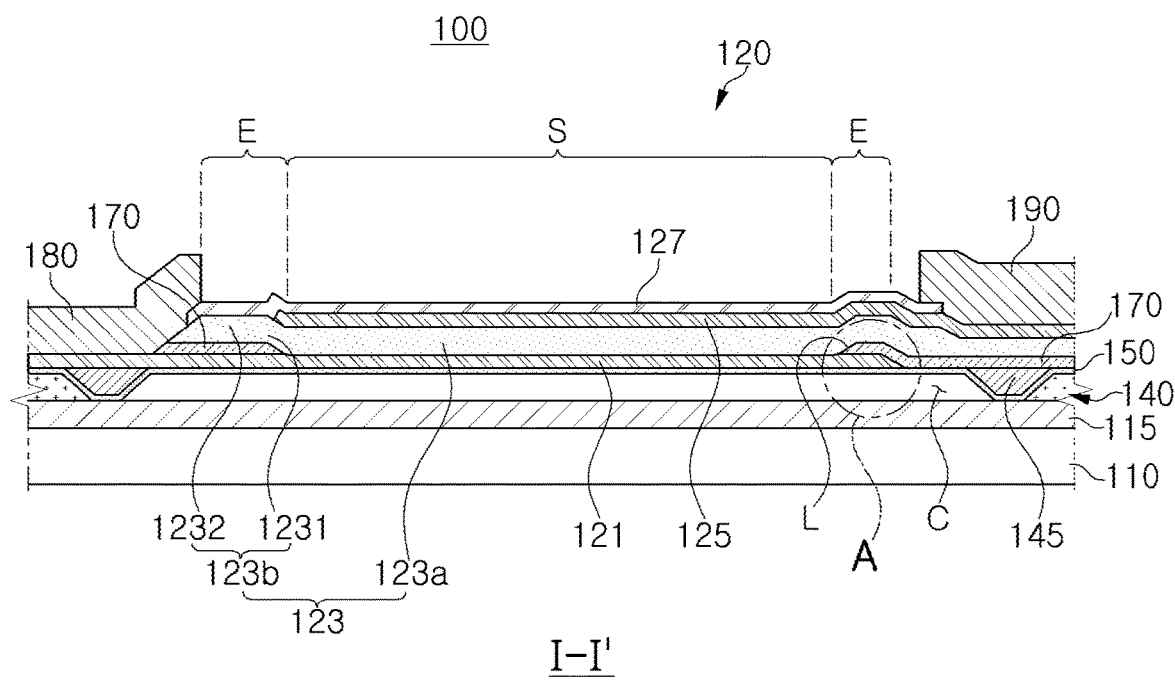
FIG. 2 is a cross-sectional view taken along line I-I' of FIG. 1.
Figure 3:
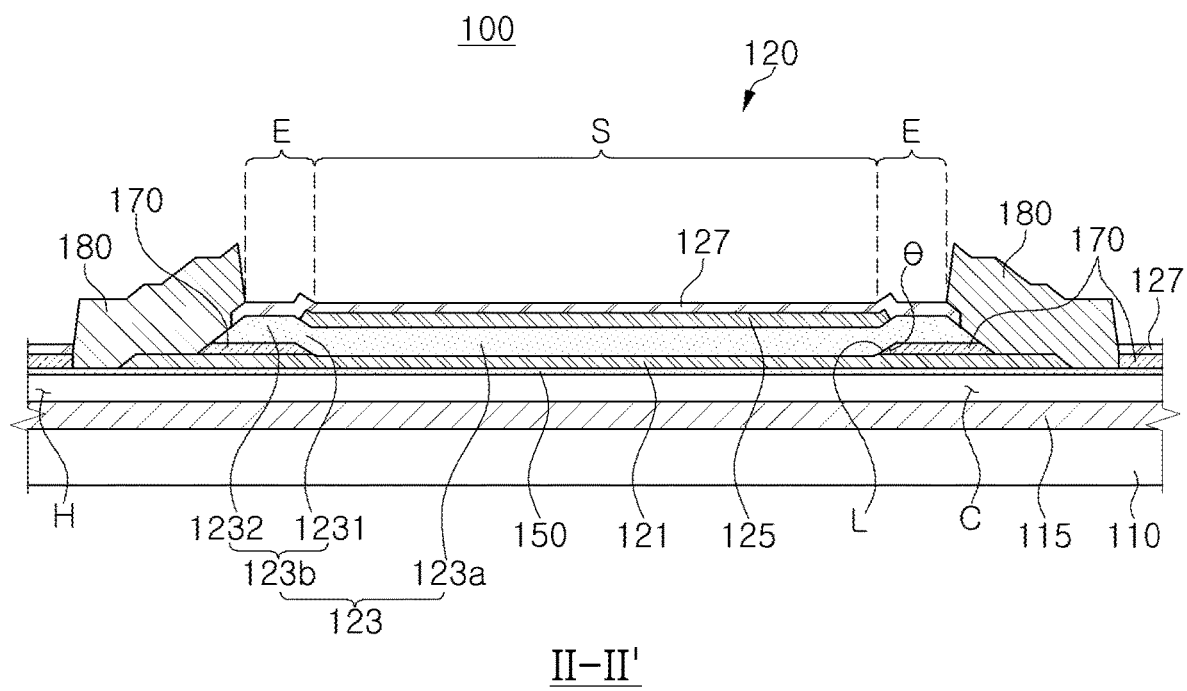
FIG. 3 is a cross-sectional view taken along line II-II' of FIG. 1.
Figure 4:
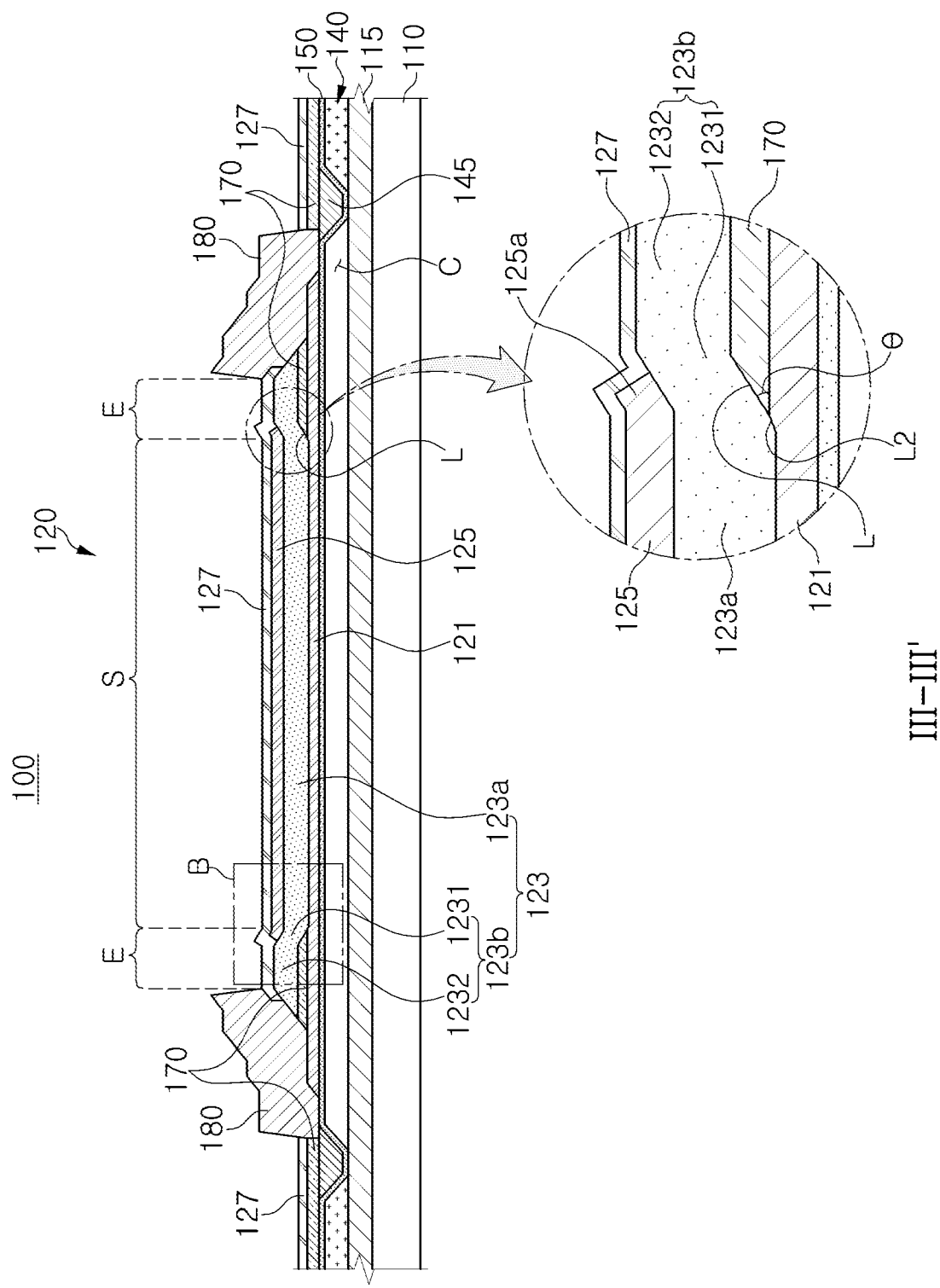
FIG. 4 is a cross-sectional view taken along line III-III' of FIG. 1.
Figure 5:
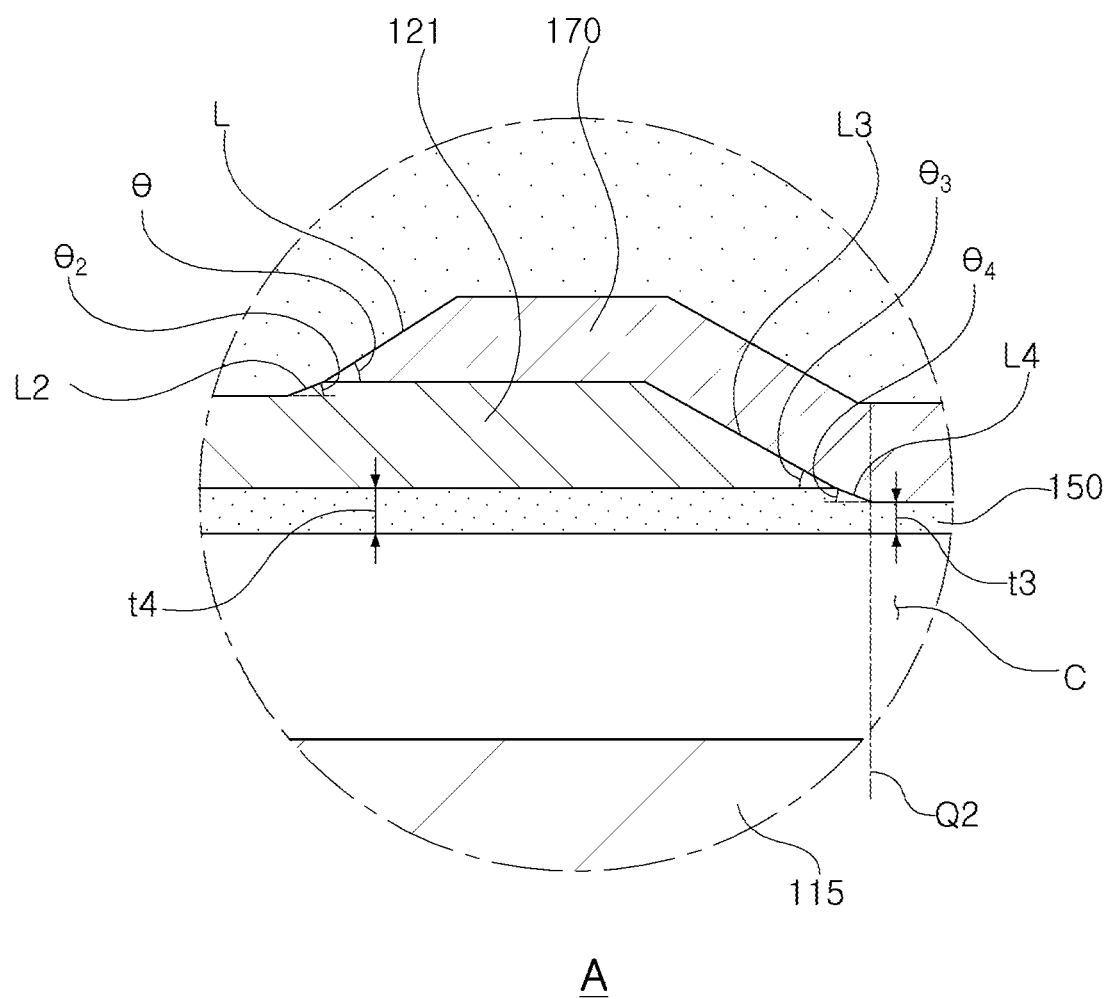
FIG. 5 is an enlarged view of a portion A of FIG. 2.

FIG. 1 is a plan view of an acoustic-wave resonator according to an embodiment of the present disclosure, and FIG. 2 is a cross-sectional view taken along line I-I' of FIG. 1. FIG. 3 is a cross-sectional view taken along line II-II' of FIG. 1, FIG. 4 is a cross-sectional view taken along line III-III' of FIG. 1, and FIG. 5 is an enlarged view of a portion A of FIG. 2.

Referring to FIGS. 1 to 5, an acoustic wave resonator 100 according to an embodiment of the present disclosure may be a bulk-acoustic wave (BAW) resonator, and may include a substrate 110, a sacrificial layer 140, a resonator 120, and an insertion layer 170.

The substrate 110 may be a silicon substrate. For example, a silicon wafer may be used as the substrate 110, or a silicon on insulator (SOI) type substrate may be used.

An insulating layer 115 may be provided on an upper surface of the substrate 110 to electrically isolate the substrate 110 and the resonator 120. In addition, the insulating layer 115 prevents the substrate 110 from being etched by an etching gas when a cavity C is formed in a manufacturing process of the acoustic-wave resonator.

In this case, the insulating layer 115 may be formed of at least one of silicon dioxide ($SiO_2$), silicon nitride ($Si_3N_4$), aluminum oxide ($Al_2O_3$), and aluminum nitride (AlN), and may be formed through any one process of chemical vapor deposition, RF magnetron sputtering, and evaporation.

A sacrificial layer 140 is formed on the insulating layer 115, and the cavity C and an etch stop portion 145 are disposed in the sacrificial layer 140.

The cavity C is formed as an empty space, and may be formed by removing a portion of the sacrificial layer 140.

As the cavity C is formed in the sacrificial layer 140, the resonator 120 formed above the sacrificial layer 140 may be formed to be entirely flat.

The etch stop portion 145 is disposed along a boundary of the cavity C. The etch stop portion 145 is provided to prevent etching from being performed beyond a cavity region in a process of forming the cavity C.

A membrane layer 150 is formed on the sacrificial layer 140, and forms an upper surface of the cavity C. Therefore, the membrane layer 150 is also formed of a material that is not easily removed in the process of forming the cavity C.

For example, when a halide-based etching gas such as fluorine (F), chlorine (Cl), or the like is used to remove a portion (e.g., a cavity region) of the sacrificial layer 140, the membrane layer 150 may be made of a material having low reactivity with the etching gas. In this case, the membrane layer 150 may include at least one of silicon dioxide ($SiO_2$) and silicon nitride ($Si_3N_4$).

The membrane layer 150 may be made of a dielectric layer containing at least one material of magnesium oxide (MgO), zirconium oxide ($ZrO_2$), aluminum nitride (AlN), lead zirconate titanate (PZT), gallium arsenide (GaAs), hafnium oxide ($HfO_2$), and aluminum oxide ($Al_2O_3$), titanium oxide ($TiO_2$), and zinc oxide (ZnO), and a metal layer containing at least one material of aluminum (Al), nickel (Ni), chromium (Cr), platinum (Pt), gallium (Ga), and hafnium (Hf). However, a configuration of the present disclosure is not limited thereto.

The resonator 120 includes a first electrode 121, a piezoelectric layer 123, and a second electrode 125. The resonator 120 is configured such that the first electrode 121, the piezoelectric layer 123, and the second electrode 125 are stacked in order from a bottom. Therefore, the piezoelectric layer 123 in the resonator 120 is disposed between the first electrode 121 and the second electrode 125.

Since the resonator 120 is formed on the membrane layer 150, the membrane layer 150, the first electrode 121, the piezoelectric layer 123, and the second electrode 125 are sequentially stacked on the substrate 110, to form the resonator 120.

The resonator 120 may resonate the piezoelectric layer 123 according to signals applied to the first electrode 121 and the second electrode 125 to generate a resonant frequency and an anti-resonant frequency.

The resonator 120 may be divided into a central portion S in which the first electrode 121, the piezoelectric layer 123, and the second electrode 125 are stacked to be substantially flat, and an extension portion E in which an insertion layer 170 is interposed between the first electrode 121 and the piezoelectric layer 123.

The central portion S is a region disposed at a center of the resonator 120, and the extension portion E is a region disposed along a periphery of the central portion S. Therefore, the extension portion E is a region extended from the central portion S externally, and refers to a region formed to have a continuous annular shape along the periphery of the central portion S. However, if necessary, the extension portion E may be configured to have a discontinuous annular shape, in which some regions are disconnected.

Accordingly, as shown in FIG. 2, in the cross-section of the resonator 120 cut so as to cross the central portion S, the extension portion E is disposed at both ends of the central portion S, respectively. An insertion layer 170 is disposed on both sides of the central portion S in the extension portion E disposed on both ends of the central portion S.

The insertion layer 170 has an inclined surface L of which a thickness becomes greater as a distance from the central portion S increases.

In the extension portion E, the piezoelectric layer 123 and the second electrode 125 are disposed on the insertion layer 170. Therefore, the piezoelectric layer 123 and the second electrode 125 located in the extension portion E have an inclined surface along the shape of the insertion layer 170.

In the present embodiment, the extension portion E is included in the resonator 120, and accordingly, resonance may occur in the extension portion E. However, the present invention is not limited thereto, and resonance may not occur in the extension portion E depending on the structure of the extension portion E, but resonance may be performed only in the central portion S.

The first electrode 121 and the second 125 may be formed of a conductor, for example, may be formed of gold, molybdenum, ruthenium, iridium, aluminum, platinum, titanium, tungsten, palladium, tantalum, chromium, nickel, or a metal containing at least one thereof, but is not limited thereto.

In the resonator 120, the first electrode 121 is formed to have larger area than the second electrode 125, and a first metal layer 180 is disposed along a periphery of the first electrode 121 on the first electrode 121. Therefore, the first metal layer 180 may be disposed to be spaced apart at a predetermined distance from the second electrode 125, and may be disposed in a form surrounding the resonator 120.

Since the first electrode 121 is disposed on a membrane layer 150, it is formed flat as a whole. Since the second electrode 125 is disposed on the piezoelectric layer 123, curving may be formed corresponding to the shape of the piezoelectric layer 123.

The first electrode 121 may be used as one of an input electrode and an output electrode for inputting and outputting an electrical signal such as a radio frequency (RF) signal.

The second electrode 125 is entirely disposed in the central portion S, and partially disposed in the extension portion E. Accordingly, the second electrode 125 may be divided into a portion disposed on the piezoelectric portion 123a of the piezoelectric layer 123 to be described later, and a portion disposed on a curved portion 123b of the piezoelectric layer 123.

More specifically, in the present embodiment, the second electrode 125 is disposed to cover an entirety of the piezoelectric portion 123a and a portion of an inclined portion 1231 of the piezoelectric layer 123. Accordingly, the second electrode (125a in FIG. 4) disposed in the extension portion E is formed to have a smaller area than an inclined surface of the inclined portion 1231, and the second electrode 125 in the resonator 120 is formed to have a smaller area than the piezoelectric layer 123.

Accordingly, as illustrated in FIG. 2, in a cross-section of the resonator 120 cut to cross the central portion S, an end of the second electrode 125 is disposed in the extension portion E. In addition, at least a portion of the end of the second electrode 125 disposed in the extension portion E is disposed to overlap the insertion layer 170. Here, 'overlap' means that when the second electrode 125 is projected on a plane on which the insertion layer 170 is disposed, a shape of the second electrode 125 projected on the plane overlaps the insertion layer 170.

The second electrode 125 may be used as one of an input electrode and an output electrode for inputting and outputting an electrical signal such as a radio frequency (RF) signal, or the like. That is, when the first electrode 121 is used as the input electrode, the second electrode 125 may be used as the output electrode, and when the first electrode 121 is used as the output electrode, the second electrode 125 may be used as the input electrode.

As illustrated in FIG. 4, when the end of the second electrode 125 is positioned on the inclined portion 1231 of the piezoelectric layer 123 to be described later, since a local structure of an acoustic impedance of the resonator 120 is formed in a sparse/dense/sparse/dense structure from the central portion S, a reflective interface reflecting a lateral wave inwardly of the resonator 120 is increased. Therefore, since most lateral waves could not flow outwardly of the resonator, and are reflected and then flow to an interior of the resonator 120, the performance of the acoustic resonator may be improved.

The piezoelectric layer 123 is a portion converting electrical energy into mechanical energy in a form of elastic waves through a piezoelectric effect, and is formed on the first electrode 121 and the insertion layer 170 to be described later.

As a material of the piezoelectric layer 123, zinc oxide (ZnO), aluminum nitride (AlN), doped aluminum nitride, lead zirconate titanate, quartz, and the like can be selectively used. In the case of doped aluminum nitride, a rare earth metal, a transition metal, or an alkaline earth metal may be further included. The rare earth metal may include at least one of scandium (Sc), erbium (Er), yttrium (Y), and lanthanum (La). The transition metal may include at least one of hafnium (Hf), titanium (Ti), zirconium (Zr), tantalum (Ta), and niobium (Nb). In addition, the alkaline earth metal may include magnesium (Mg).

In order to improve piezoelectric properties, when a content of elements doped with aluminum nitride (AlN) is less than 0.1 at %, a piezoelectric property higher than aluminum nitride (AlN) cannot be realized. When the content of the elements exceeds 30 at %, it is difficult to fabricate and control the composition for deposition, such that uneven or unwanted crystalline phases may be formed.

Therefore, in the present embodiment, the content of elements doped with aluminum nitride (AlN) is in a range of 0.1 to 30 at %.

In the present embodiment, the piezoelectric layer is doped with scandium (Sc) in aluminum nitride (AlN). In this case, a piezoelectric constant may be increased to increase $K_t^2$ of the acoustic resonator. However, the configuration of the present disclosure is not limited thereto.

The piezoelectric layer 123 according to the present embodiment includes a piezoelectric portion 123a disposed in the central portion S, and a curved portion 123b disposed in the extension portion E.

The piezoelectric portion 123a is a portion directly stacked on the upper surface of the first electrode 121. Therefore, the piezoelectric portion 123a is interposed between the first electrode 121 and the second electrode 125 to form a flat shape together with the first electrode 121 and the second electrode 125.

The curved portion 123b may be understood as a region extending from the piezoelectric portion 123a to the outside and positioned in the extension portion E.

The curved portion 123b is disposed on the insertion layer 170 to be described later, and is formed in a shape in which the upper surface is raised along the shape of the insertion layer 170. Accordingly, the piezoelectric layer 123 is curved at a boundary between the piezoelectric portion 123a and the curved portion 123b, and the curved portion 123b is raised corresponding to the thickness and shape of the insertion layer 170.

The curved portion 123b may be divided into an inclined portion 1231 and an extension portion 1232.

The inclined portion 1231 refers to a portion that is inclined along an inclined surface L of the insertion layer 170 to be described later. The extension portion 1232 refers to a portion extending from the inclined portion 1231 to the outside.

The inclined portion 1231 is formed parallel to the inclined surface L of the insertion layer 170, and an inclination angle of the inclined portion 1231 may be formed to be the same as an inclination angle of the inclined surface L of the insertion layer 170.

The insertion layer 170 is disposed along a surface formed by the membrane layer 150, the first electrode 121, and the etch stop portion 145. Therefore, the insertion layer 170 is partially disposed in the resonator 120, and is disposed between the first electrode 121 and the piezoelectric layer 123.

The insertion layer 170 is disposed around the central portion S to support the curved portion 123b of the piezoelectric layer 123. Accordingly, the curved portion 123b of the piezoelectric layer 123 may be divided into an inclined portion 1231 and an extension portion 1232 along the shape of the insertion layer 170.

The insertion layer 170 is disposed in a region except for the central portion S. For example, the insertion layer 170 may be disposed on the substrate 110 in an entire region except for the central portion S, or in some regions.

The insertion layer 170 is formed to have a thickness becoming greater as the side surface facing the central portion S moves away from the central portion S. Thereby, the insertion layer 170 is formed of an inclined surface L having a constant inclination angle $\theta$ with the side surface facing the central portion S.

When the inclination angle $\theta$ of the side surface of the insertion layer 170 is formed smaller than 5°, in order to manufacture it, since the thickness of the insertion layer 170 should be formed very thinly or an area of the inclined surface L should be excessively large, it is practically difficult to be implemented.

In addition, when the inclination angle θ of the side surface of the insertion layer 170 is greater than 70°, the inclination angle of the piezoelectric layer 123 or the second electrode 125 stacked on the insertion layer 170 is also formed to be greater than 70°. In this case, since the piezoelectric layer 123 or the second electrode 125 stacked on the inclined surface L is excessively curved, cracks may be generated in the curved portion.

Therefore, in the present embodiment, the inclination angle θ of the inclined surface L is formed in a range of 5° or more and 70° or less.

In the present embodiment, the inclined portion 1231 of the piezoelectric layer 123 is formed along the inclined surface L of the insertion layer 170, and thus is formed to have the same inclination angle as the inclined surface L of the insertion layer 170. Therefore, the inclination angle of the inclined portion 1231 is also formed in the range of 5° or more and 70° or less, similarly to the inclined surface L of the insertion layer 170. The configuration is equally applied to the second electrode 125 stacked on the inclined surface L of the insertion layer 170.

The insertion layer 170 may be formed of a dielectric material such as silicon oxide (SiO$_2$), aluminum nitride (AlN), aluminum oxide (Al$_2$O$_3$), silicon nitride (Si$_3$N$_4$), magnesium oxide (MgO), zirconium oxide (ZrO$_2$), lead zirconate titanate (PZT), and gallium Arsenic (GaAs), hafnium oxide (HfO$_2$), titanium oxide (TiO$_2$), and zinc oxide (ZnO), but may be formed of material from that of the piezoelectric layer 123.

In addition, the insertion layer 170 may be implemented with a metal material. When the volume acoustic resonator of the present embodiment is used for 5G communication, a lot of heat is generated by the resonator, and thus heat generated by the resonator 120 needs to be smoothly released. To this end, the insertion layer 170 of this embodiment may be made of an aluminum alloy material containing scandium (Sc).

The resonator 120 is disposed to be spaced apart from the substrate 110 through a cavity C disposed below the membrane layer 150. Thus, the membrane layer 150 is disposed below the first electrode 121 and the insertion layer 170 to support the resonator 120.

The cavity C is formed as an empty space, and may be formed by removing a portion of a sacrificial layer 140 by supplying an etching gas (or an etching solution) to an inlet hole (H in FIG. 1) in a process of manufacturing an acoustic resonator.

A protective layer 127 is disposed along the surface of the acoustic resonator 100 to protect the acoustic resonator 100 from the outside. The protective layer 127 may be disposed along a surface formed by the second electrode 125 and the curved portion 123b of the piezoelectric layer 123.

The protective layer 127 may be formed as a dielectric layer containing any one of silicon nitride (Si$_3$N$_4$), silicon oxide (SiO$_2$), magnesium oxide (MgO), zirconium oxide (ZrO$_2$), aluminum nitride (AlN), lead titanate silicate (PZT), gallium arsenide (GaAs), hafnium oxide (HfO$_2$), aluminum oxide (Al$_2$O$_3$), titanium oxide (TiO$_2$), and zinc oxide (ZnO), but is not limited thereto.

The protective layer 127 may be formed as a single layer, but may be formed by stacking two layers having different materials as necessary. In addition, the protective layer 127 may be partially removed to adjust a frequency in a final process. For example, the thickness of the protective layer 127 may be adjusted in a frequency trimming process.

The first electrode 121 and the second electrode 125 may extend outside of the resonator 120. The first metal layer 180 and the second metal layer 190 may be disposed on the upper surface of the extended portion, respectively.

The first metal layer 180 and the second metal layer 190 may be made of gold (Au), a gold-tin (Au—Sn) alloy, copper (Cu), a copper-tin (Cu—Sn) alloy, aluminum (Al), an aluminum alloy, or combinations thereof. Here, the aluminum alloy may be an aluminum-germanium (Al—Ge) alloy or an aluminum-scandium (Al—Sc) alloy.

The first metal layer 180 and the second metal layer 190 may function as a connection wiring electrically connecting the first and second electrodes 121 and 125, respectively, of the acoustic resonator according to the present embodiment on the substrate 110 and the electrodes of other acoustic resonators disposed adjacent to each other, or function as a terminal for external connection. However, they are not limited thereto.

The first metal layer 180 may penetrate the protective layer 127 and be bonded to the first electrode 121.

In addition, in the resonator 120, the first electrode 121 is formed with a larger area than the second electrode 125, and the first metal layer 180 is formed on the periphery of the first electrode 121.

Therefore, the first metal layer 180 is disposed along the periphery of the resonator 120, and thus is disposed in a form surrounding the second electrode 125. However, it is not limited thereto.

Figure 6:
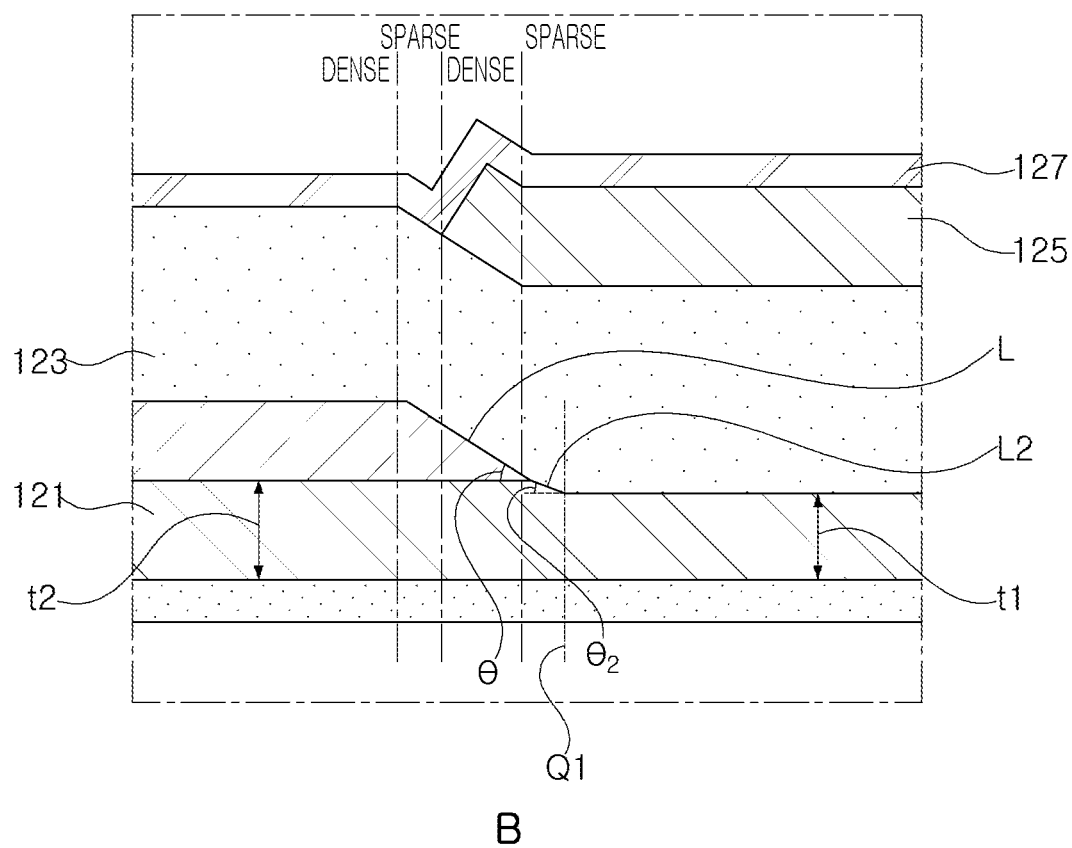
FIG. 6 is an enlarged view of a portion B of FIG. 4.

In the bulk-wave acoustic resonator 100 according to the present embodiment configured as described above, as illustrated in FIGS. 4 to 6, a second inclined surface L2 is formed on the upper surface of the first electrode 121.

The second inclined surface L2 is formed extending the inclined surface (L, hereinafter, the first inclined surface) of the above-described insertion layer 170, and is formed to have an inclination angle θ2, less than the inclination angle θ of the first inclined surface L.

In a cross-section of the resonator 120 cut so as to cross the central portion S, the insertion layer 170 may be respectively disposed in the extension portion E located on both sides of the central portion S. The second inclined surface L2 is disposed on both sides of the central portion S in a form of extending the first inclined surface L. As such, the second inclined surface L2 may be formed along the entire first inclined surface L formed in the insertion layer 170.

Since the insertion layer 170 is disposed along the boundary of the central portion Sin the extension portion E, the second inclined surface L2 is disposed along the boundary of the central portion S in the central portion S. In addition, the upper surface of the first electrode 121 extending from a lower end of the second inclined surface L2 is formed as a flat surface. Therefore, in the first electrode 121, the upper surface in the central portion S and the upper surface in the extension portion E are disposed on different planes. In addition, by the second inclined surface L2, a thickness t1 of the first electrode 121 disposed in the central portion S, which is a lower end portion of the second inclined surface L2, is formed to be less than a thickness t2 of the first electrode 121 disposed in the extension portion E, which is an upper end portion of the second inclined surface L2.

The second inclined surface L2 may be formed by etching a portion of the upper surface of the first electrode 121 positioned in the central portion S. In this process, the insertion layer 170 may be used as a mask. Accordingly, the second inclined surface L2 is formed in a form extending from the first inclined surface L.

When the second inclined surface L2 is provided in the first electrode 121 as described above, a reflective interface Q1 may be formed along the boundary between the flat surface of the first electrode 121 and the second inclined surface L2. Therefore, in addition to the sparse/dense/sparse/dense structure shown in FIG. 4, since an additional reflective interface Q1 is provided, it is possible to further suppress leakage of energy in the resonator 120 out of the resonator 120, thereby improving the performance of the bulk-acoustic wave resonator.

In addition, the bulk-acoustic wave resonator according to the present embodiment may include a fourth inclined surface L4 formed in the membrane layer 150, as shown in FIG. 5.

The fourth inclined surface L4 is formed to extend an inclined surface L3 (hereinafter referred to as the third inclined surface) formed at the end of the first electrode 121.

Similar to the second inclined surface L2, the fourth inclined surface L4 is formed to have an inclination angle θ4, less than the inclination angle θ3 of the third inclined surface L3.

By the fourth inclined surface L4, a thickness t3 of the membrane layer 150 in the lower end portion of the fourth inclined surface L4 is formed to be less than a thickness t4 of the membrane layer 150 in the upper end portion of the fourth inclined surface L4.

The fourth inclined surface L4 may be formed in the membrane layer 150 along the entire third inclined surface L3 formed on the first electrode 121.

The fourth inclined surface L4 may be formed by partially etching the upper surface of the membrane layer 150. In this process, the first electrode 121 may be used as a mask. Accordingly, the fourth inclined surface L4 is formed extending from the third inclined surface L3.

When the fourth inclined surface L4 is provided in the membrane layer 150 as described above, a reflective interface Q2 may be formed along the boundary of the fourth inclined surface L4. Therefore, since an additional reflective interface Q2 is provided, it is possible to further suppress leakage of energy in the resonator 120 out of the resonator 120.

The present disclosure is not limited to the above-described embodiment, and various modifications are possible.

Figure 7:
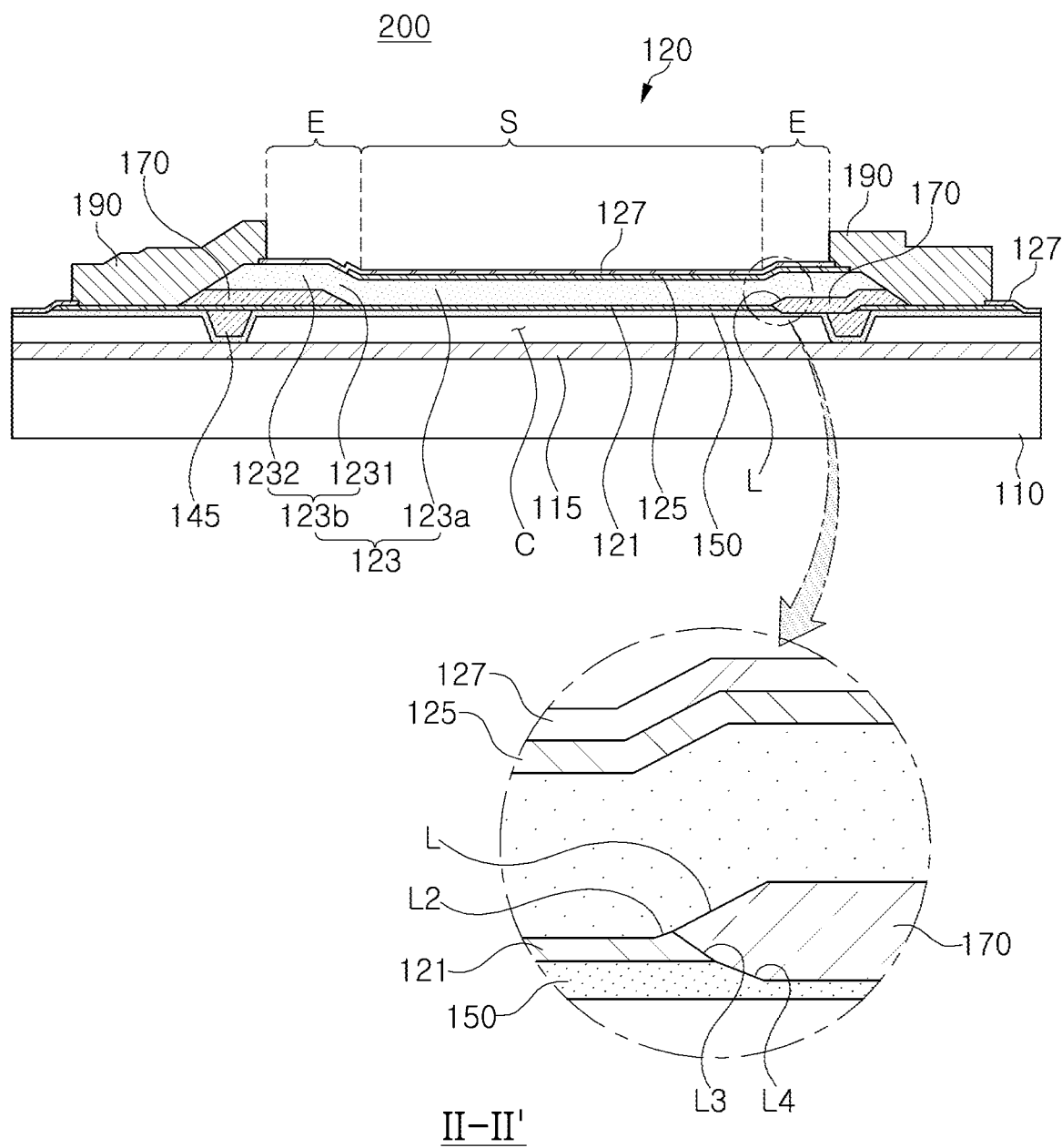
FIG. 7 is a cross-sectional view schematically illustrating a bulk-acoustic wave resonator according to another embodiment of the present disclosure.

FIG. 7 is a cross-sectional view schematically illustrating a bulk-acoustic resonator according to another embodiment of the present disclosure.

Referring to FIG. 7, a bulk-acoustic wave resonator 200 illustrated in the present embodiment is configured similarly to the bulk-acoustic wave resonator illustrated in FIG. 3, and has the greatest difference in shape of an insertion layer 170 disposed on the end side of the first electrode 121. Therefore, detailed descriptions of the same components as in the above-described embodiment may be omitted, and the differences will mainly be described further.

As shown in FIG. 7, in the cross-section of the resonator 120 cut to cross the central portion S, the insertion layer 170 is respectively disposed in the extension portion E located on both sides of the central portion S, respectively, of which the right insertion layer 170, contacting the end of the first electrode 121 is configured to contact only the third inclined surface L3, which is an inclined surface of the end of the first electrode 121 without covering the upper surface of the first electrode 121. For example, in a portion where the third inclined surface L3 is formed, the insertion layer 170 is formed to contact only the third inclined surface L3 without contacting the upper surface of the first electrode 121.

To this end, the insertion layer 170 of the present embodiment may be formed thicker than the first electrode 121.

As in the above-described embodiment, the first electrode 121 of the bulk-wave acoustic resonator 200 of the present embodiment has a second inclined surface L2 extending from the first inclined surface L of the insertion layer 170 and a third inclined surface L3 formed at the end, and the membrane layer 150 has a fourth inclined surface L4 extending from the third inclined surface L3. In addition, the second inclined surface L2 is formed to have an inclination angle, less than the inclination angle of the first inclined surface L, and the fourth inclined surface L4 is formed to have an inclination angle, less than the inclination angle of the third inclined surface L3.

In addition, the insertion layer 170 on the right side described above, is disposed so that the end thereof contacts the third inclined surface L3 of the first electrode 121 and the fourth inclined surface L4 of the membrane layer 150. Accordingly, the right insertion layer 170, which is disposed to contact the end of the first electrode 121, has three inclined surfaces having different inclination angles at the end. As described above, the insertion layer 170 of the present disclosure can be modified in various forms.

Figure 8:
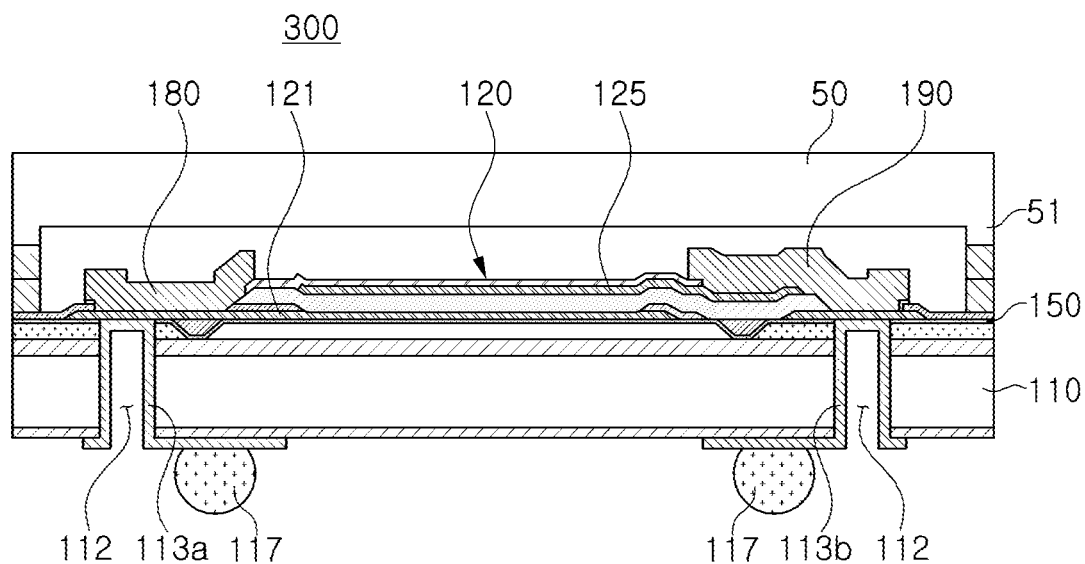
FIG. 8 is a cross-sectional view schematically illustrating a bulk-acoustic wave resonator according to another embodiment of the present disclosure.

FIG. 8 is a cross-sectional view schematically illustrating a volume acoustic resonator according to another embodiment of the present disclosure. Referring to FIG. 8, a bulk-acoustic wave resonator 300 shown in the present embodiment includes the bulk-acoustic wave resonator shown in FIG. 2 and a cap 50.

The cap 50 is provided to protect the resonator 120 from an external environment.

The cap 50 may be formed in a form of a cover having an internal space in which the resonator 120 is accommodated. Therefore, the cap 50 is bonded to the substrate 110 in a form in which a side wall 51 surrounds a periphery of the resonator 120.

The cap 50 may be bonded to the substrate 110 through a bonding member. Therefore, a lower surface of the side wall 51 is used as a bonding surface with the substrate 110.

The cap 50 may be formed through wafer bonding at a wafer level. That is, a substrate wafer on which a plurality of unit substrates 110 are disposed and a cap wafer on which a plurality of caps 50 are disposed can be integrally formed by bonding to each other. Silicon (Si) may be used as a material of the cap, but is not limited thereto.

The substrate 110 of the present embodiment has a plurality of via holes 112 penetrating the substrate 110 on the lower surface thereof. In addition, connection conductors 113a and 113b are formed inside each of the via holes 112.

The connection conductors 113a and 113b may be formed on an entire inner surface of the via hole 112, but are not limited thereto, or may be partially formed or formed in a form of completely filling an internal space of the via hole 112.

In addition, one end of the connection conductors 113a and 113b is connected to an external electrode 117 formed on the lower surface of the substrate 110, and the other end thereof is connected to the first electrode 121 or the second electrode 125.

For example, the first connection conductor 113a according to the present embodiment electrically connects the first electrode 121 and an external electrode 117, and the second connection conductor 113b electrically connects the second electrode 125 and another external electrode 117.

Therefore, the first connection conductor 113a may penetrate the substrate 110 and the membrane layer 150 and be electrically connected to the first electrode 121, and the second connection conductor 113b may penetrate the substrate 110 and the membrane layer 150, and be electrically connected to the second electrode 125. In this case, the second connection conductor 113b may be electrically connected to the second electrode 125 through the second metal layer 190.

In the present embodiment, only two via holes 112 and two connection conductors 113a and 113b are illustrated and described, but the present disclosure is not limited thereto, and if necessary, a larger number of via holes 112 and connection conductors 113a and 113b may be provided.

Figure 9:
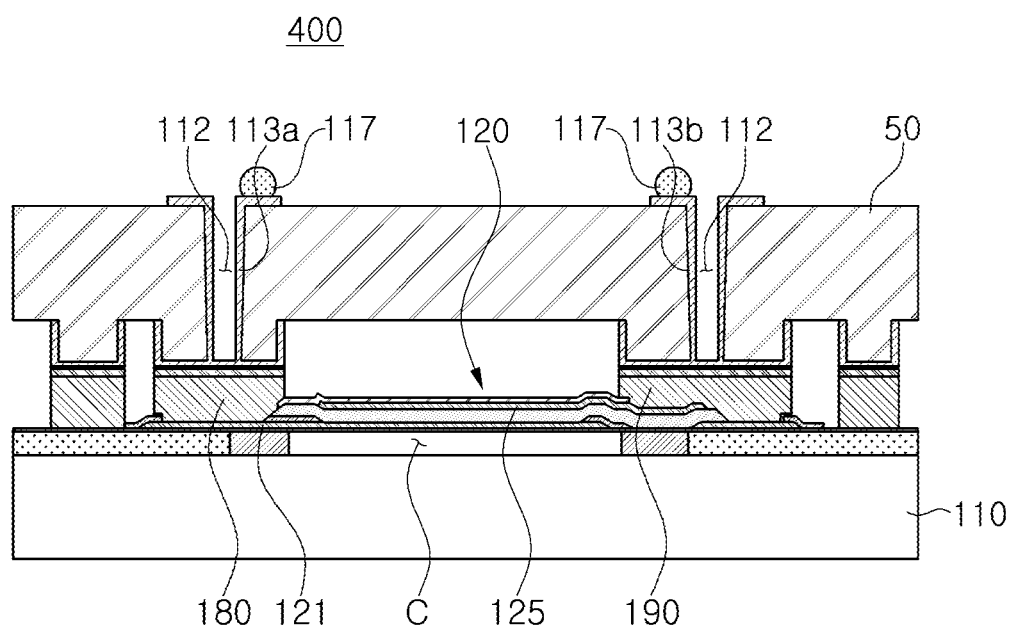
FIG. 9 is a cross-sectional view schematically illustrating a bulk-acoustic wave resonator according to another embodiment of the present disclosure.

FIG. 9 is a cross-sectional view schematically illustrating a bulk-acoustic wave resonator according to another embodiment of the present disclosure.

Referring to FIG. 9, the bulk-acoustic wave resonator 400 illustrated in the present embodiment is configured similarly to the bulk-acoustic wave resonator illustrated in FIG. 8, except for a difference that the via holes 112 and the connection conductors 113a and 113b are disposed to penetrate the cap 50 rather than the substrate 110.

Accordingly, in the present embodiment, the via holes 112 and the connection conductors 113a and 113b are positioned above the first metal layer 180 and the second metal layer 190, and the connection conductors 113a and 113b are respectively connected to the first metal layer 180 and the second metal layer 190 through the via holes 112.

Therefore, the connection conductors 113a and 113b are electrically connected to the first electrode 121 and the second electrode 125 via the first metal layer 180 and the second metal layer 190, respectively.

In this case, upper surfaces (or bonding surfaces) of the first metal layer 180 and the second metal layer 190 may be disposed on the same planes so that the cap 50 can be firmly bonded to the first metal layer 180 and the second metal layer 190.

In the bulk-acoustic wave resonator 400 according to the present embodiment configured as described above, an external electrode 117 may be disposed on an upper surface (referring to FIG. 9) of an external surface of the cap 50. In this case, the upper surface of the cap 50 may be used as a mounting surface.

As set forth above, according to the present disclosure, since a bulk-acoustic wave resonator provides an additional reflective interface through an inclined surface provided on the first electrode, leakage of energy in the resonator to the outside of the resonator can be suppressed as much as possible, thereby improving the performance of the bulk-acoustic wave resonator.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator comprising:
   a resonator comprising a central portion in which a first electrode, a piezoelectric layer, and a second electrode are sequentially stacked on a substrate, and an extension portion disposed along a periphery of the central portion; and
   an insertion layer disposed between the piezoelectric layer and the first electrode in the extension portion to raise the piezoelectric layer,
   wherein the insertion layer comprises a first inclined surface formed along a side surface facing the central portion, and the first electrode comprises a second inclined surface extending from a lower end of the first inclined surface of the insertion layer.

2. The bulk-acoustic wave resonator of claim 1, wherein the second inclined surface comprises a lower inclination angle than the first inclined surface.

3. The bulk-acoustic wave resonator of claim 1, wherein the first electrode comprises a thickness of a lower end portion of the second inclined surface less than a thickness of an upper end portion of the second inclined surface.

4. The bulk-acoustic wave resonator of claim 1, wherein the second inclined surface is disposed in the central portion.

5. The bulk-acoustic wave resonator of claim 1, wherein the first electrode comprises an upper surface in the central portion and an upper surface in the extension portion disposed on different planes from each other.

6. The bulk-acoustic wave resonator of claim 1, further comprising
   a membrane layer disposed below the first electrode and the insertion layer to support the resonator; and
   a cavity separating the resonator from the substrate.

7. The bulk-acoustic wave resonator of claim 1, wherein a third inclined surface is disposed along an end of the first electrode, and
   wherein the membrane layer comprises a fourth inclined surface extending from a lower end of the third inclined surface.

8. The bulk-acoustic wave resonator of claim 7, wherein the fourth inclined surface comprises a lower inclination angle than the third inclined surface.

9. The bulk-acoustic wave resonator of claim 7, wherein an end of the insertion layer contacts the third inclined surface of the first electrode.

10. The bulk-acoustic wave resonator of claim 9, wherein the insertion layer is thicker than the first electrode.

11. The bulk-acoustic wave resonator of claim 1, further comprising a cap accommodating the resonator therein and bonded to the substrate.

12. The bulk-acoustic wave resonator of claim 11, further comprising
   a plurality of via holes disposed to penetrate the cap; and
   a plurality of connection conductors disposed in the plurality of via holes to electrically connect the first electrode and the second electrode to an outside.

13. The bulk-acoustic wave resonator of claim 12, further comprising external electrodes bonded to the plurality of connection conductors exposed to an external surface of the cap.

14. The bulk-acoustic wave resonator of claim 12, further comprising a first metal layer and a second metal layer disposed outside of the resonator and bonded to the first electrode and the second electrode, respectively, wherein the plurality of connection conductors are electrically connected to the first electrode and the second electrode, respectively, via the first metal layer and the second metal layer.

15. The bulk-acoustic wave resonator of claim 1, wherein the piezoelectric layer comprises an inclined portion disposed on the first inclined surface, and
wherein an end of the second electrode is disposed on the inclined portion of the piezoelectric layer.

16. A bulk-acoustic wave resonator, comprising:
a resonator comprising a central portion in which a first electrode, a piezoelectric layer, and a second electrode are sequentially stacked on a substrate in this order, and an extension portion disposed along a periphery of the central portion; and
an insertion layer disposed below the piezoelectric layer in the extension portion to raise the piezoelectric layer,
wherein the first electrode comprises a thickness in the central portion less than a thickness in the extension portion.

17. A bulk-acoustic wave resonator, comprising:
a central portion comprising a first electrode, a piezoelectric layer, and a second electrode sequentially stacked on a substrate; and
an extension portion comprising the first electrode, an insertion layer, the piezoelectric layer, and the second electrode sequentially stacked on the substrate disposed along a periphery of the central portion,
wherein the first electrode comprises a first reflective interface in the central portion, and
wherein the first reflective interface comprises an inclined surface extending from a lower end of the insertion layer facing the central portion.

18. The bulk-acoustic wave resonator of claim 17, further comprising a membrane layer disposed below the first electrode to support the first electrode; and
a cavity separating the first electrode from the substrate,
wherein the membrane layer comprises a second reflective interface in the extension portion.

19. The bulk-acoustic wave resonator of claim 18, wherein the second reflective interface comprises an inclined surface extending from a lower end of the first electrode facing away from the central portion.

20. A bulk-acoustic wave resonator comprising:
a resonator comprising a central portion in which a first electrode, a piezoelectric layer, and a second electrode are sequentially stacked on a substrate, and an extension portion disposed along a periphery of the central portion; and
an insertion layer disposed below the piezoelectric layer in the extension portion to raise the piezoelectric layer,
wherein the insertion layer comprises a first inclined surface formed along a side surface facing the central portion, and the first electrode comprises a second inclined surface extending from a lower end of the first inclined surface of the insertion layer, and
wherein the first electrode comprises a thickness of a lower end portion of the second inclined surface less than a thickness of an upper end portion of the second inclined surface.

* * * * *